United States Patent
Shen et al.

(10) Patent No.: US 9,653,422 B2
(45) Date of Patent: May 16, 2017

(54) CHIP PACKAGE AND METHOD FOR FORMING THE SAME

(71) Applicant: XINTEC INC., Taoyuan (TW)

(72) Inventors: Chia-Lun Shen, Taoyuan (TW); Yi-Ming Chang, Taoyuan (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/673,657

(22) Filed: Mar. 30, 2015

(65) Prior Publication Data

US 2015/0279808 A1 Oct. 1, 2015

(30) Foreign Application Priority Data

Mar. 31, 2014 (TW) .............................. 103111918 A
Mar. 4, 2015 (TW) .............................. 104106789 A

(51) Int. Cl.
*H01L 23/00* (2006.01)
*H01L 21/78* (2006.01)
*H01L 21/306* (2006.01)
*H01L 21/48* (2006.01)

(52) U.S. Cl.
CPC ........ *H01L 24/32* (2013.01); *H01L 21/30604* (2013.01); *H01L 21/48* (2013.01); *H01L 21/78* (2013.01); *H01L 24/09* (2013.01); *H01L 24/49* (2013.01); *H01L 24/73* (2013.01); *H01L 24/83* (2013.01); *H01L 2224/02373* (2013.01); *H01L 2224/32225* (2013.01); *H01L 2224/451* (2013.01); *H01L 2224/48091* (2013.01); *H01L 2224/48106* (2013.01); *H01L 2224/48227* (2013.01); *H01L 2224/73265* (2013.01); *H01L 2224/8385* (2013.01); *H01L 2224/8389* (2013.01); *H01L 2924/00014* (2013.01); *H01L 2924/10155* (2013.01); *H01L 2924/10156* (2013.01); *H01L 2924/12042* (2013.01); *H01L 2924/37001* (2013.01)

(58) Field of Classification Search
CPC ... H01L 21/30604; H01L 21/78; H01L 24/32; H01L 24/73; H01L 24/83; H01L 2224/02373; H01L 2224/32225; H01L 2224/48227; H01L 2224/8385; H01L 2924/37001; H01L 2224/48106; H01L 2224/73265; H01L 2224/8389; H01L 2924/00014; H01L 24/80; H01L 24/09; H01L 24/49; H01L 21/4857; H01L 2224/48091

See application file for complete search history.

(56) References Cited

U.S. PATENT DOCUMENTS 7,696,014 B2 * 4/2010 Kitahara .................... C09J 5/06
257/E21.517
2008/0187613 A1 8/2008 Yoon
(Continued)

*Primary Examiner* — Jasmine Clark
(74) *Attorney, Agent, or Firm* — Liu & Liu

(57) ABSTRACT

A method for forming a chip package is provided. The method includes providing a first substrate and a second substrate. The first substrate is attached onto the second substrate by an adhesive layer. A first opening is formed to penetrate the first substrate and the adhesive layer and separate the first substrate and the adhesive layer into portions. A chip package formed by the method is also provided.

19 Claims, 9 Drawing Sheets

(56) References Cited

U.S. PATENT DOCUMENTS

| | | | |
|---|---|---|---|
| 2009/0227089 A1* | 9/2009 | Plaut | C09J 5/00 438/464 |
| 2010/0127409 A1* | 5/2010 | Jiang | H01L 21/56 257/783 |
| 2013/0000842 A1 | 1/2013 | Clyne et al. | |

* cited by examiner

CHIP PACKAGE AND METHOD FOR FORMING THE SAME

CROSS REFERENCE TO RELATED APPLICATIONS

This application is based on, and claims priority of Taiwan Patent Application No. 103111918, filed on Mar. 31, 2014, and priority of Taiwan Patent Application No. 104106789, filed on Mar. 4, 2015, the entirety of which are incorporated by reference herein.

BACKGROUND OF THE INVENTION

Field of the Invention

The invention relates to chip packaging technology, and in particular to a chip package and methods for forming the same.

Description of the Related Art

In general, manufacturing processes of chip packages comprise attaching a wafer to a tape and separating the wafer into a plurality of chips by a dicing process. The chips are then separated from the tape for subsequent processing.

However, in conventional manufacturing processes, the cutting edge of the dicing blade can become worn away as a result of multiple dicing processes, such that edge sidewalls of the diced chip, which are adjacent to the tape, may have residue. Residues form protrusions on the edge sidewalls of the chip. During the subsequent processes and when the chip package is used, the edge sidewalls of the chip can become cracked due to these protrusions. Accordingly, the reliability and quality of the chip package are reduced.

Thus, there exists a need in the art for development of a chip package and methods for forming the same capable of mitigating or eliminating the aforementioned problems.

BRIEF SUMMARY OF THE INVENTION

An embodiment of the invention provides a method for forming a chip package comprising providing a first substrate and a second substrate. The first substrate is attached onto the second substrate by an adhesive layer. A plurality of first openings is formed. The first openings penetrate through the first substrate and the adhesive layer, such that the first substrate and the adhesive layer are separated into a plurality of portions.

An embodiment of the invention provides a chip package comprising a first substrate. The first substrate has a conducting pad therein. An adhesive layer is disposed on the first substrate. A stepped sidewall is located outside of the conducting pad. A first portion of the stepped sidewall is coplanar with a sidewall of the first substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive elements or electronic components of integrated circuits, such as digital or analog circuits. For example, the chip package may be related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level packaging (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the above-mentioned wafer-level packaging process may also be adapted to form a chip package having multi-layer integrated circuit devices by stacking a plurality of wafers having integrated circuits.

An exemplary embodiment of a method for forming a chip package according to the invention is illustrated with FIGS. 1A to 1D, wherein FIGS. 1A to 1D are cross-sectional views of an exemplary embodiment of a method for forming a chip package according to the invention.

Figure 1A:
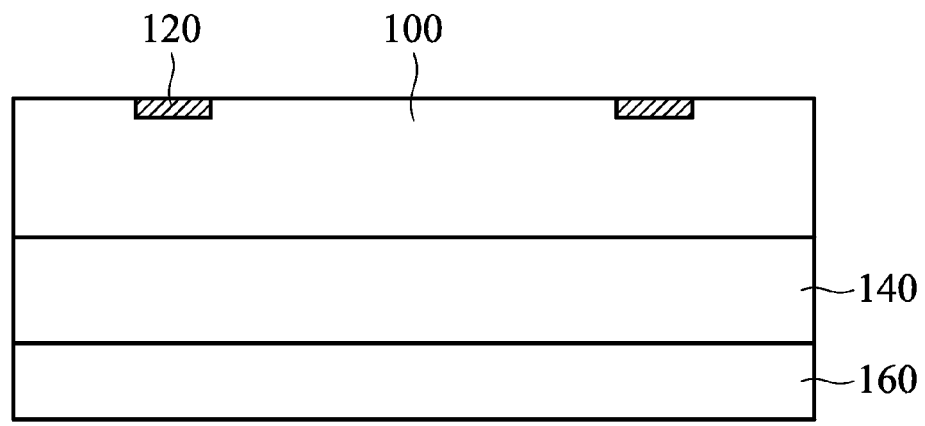
FIGS. 1A to 1D are cross-sectional views of an exemplary embodiment of a method for forming a chip package according to the invention.

Referring to FIG. 1A, a first substrate 100 is provided. In one embodiment, the first substrate 100 may be a silicon substrate or another semiconductor substrate. In another embodiment, the first substrate 100 is a silicon wafer so as to facilitate the wafer-level packaging process. As an example, the first substrate 100 herein is a silicon wafer.

In the embodiment, the first substrate 100 has a plurality of conducting pads. The conducting pads are correspondingly disposed in each chip region (not shown) of the first substrate 100, and may be adjacent to the upper surface of the first substrate 100. To simplify the diagram, only two conducting pads 120 in one chip region of the first substrate 100 are depicted herein.

In one embodiment, the conducting pad 120 may be a single conducting layer or comprise multiple conducting layers. Only a single conducting layer is depicted herein as an example.

In the embodiment, the first substrate 100 may have a sensing device (not shown) located on the upper surface of the first substrate 100. In one embodiment, the sensing device may be electrically connected to the conducting pads 120 through an interconnection structure (not shown). The sensing device may comprise an environment-sensing element (such as a temperature-sensing element, a humidity-sensing element, or a pressure-sensing element), a biometric-sensing element (such as a fingerprint-recognition element), an image-sensing element or another suitable sensing element.

The first substrate 100 is attached onto a second substrate 160 by an adhesive layer 140. In the embodiment, the adhesive layer 140 may comprise a tape, a die-attach film (DAF), or another suitable adhesive material. Furthermore, the thickness of the adhesive layer 140 may be in a range of 5 μm to 20 μm. In the embodiment, the second substrate 160 serves as a temporary carrier substrate/wafer, and may comprise silicon, glass, or another suitable supporting structure. Moreover, the thickness of the second substrate 160 may be greater than 100 μm.

Figure 1B:
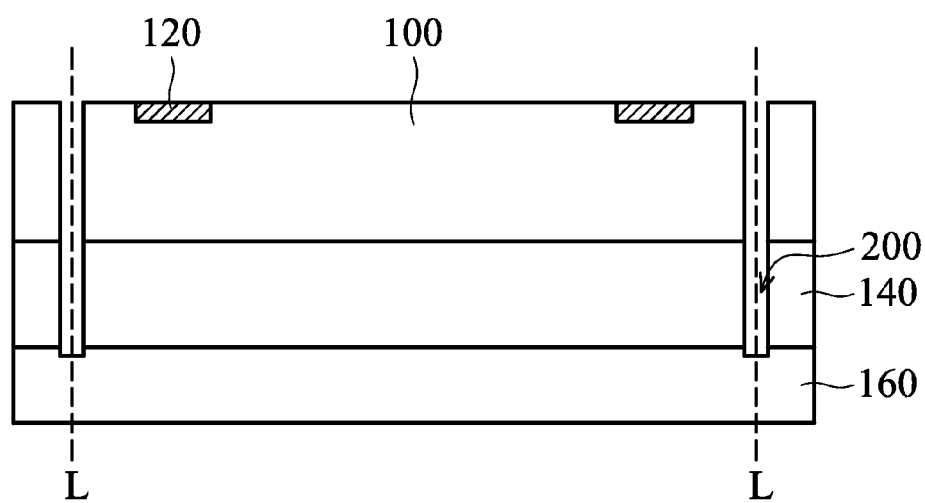

Referring to FIG. 1B, first openings 200 may be formed by a dicing process. The first openings 200 penetrate through the first substrate 100 and the adhesive layer 140, and separate the first substrate 100 and the adhesive layer 140 into a plurality of portions. For example, the second substrate 160 is used as a support, and the first substrate 100 and the adhesive layer 140 are diced along scribe lines L, which define the chip regions of the first substrate 100, to form the first openings 200. In one embodiment, the first openings 200 extend into the second substrate 160. In another embodiment, the first openings 200 may merely expose the surface of the second substrate 160 without extending into the second substrate 160.

Figure 1C:
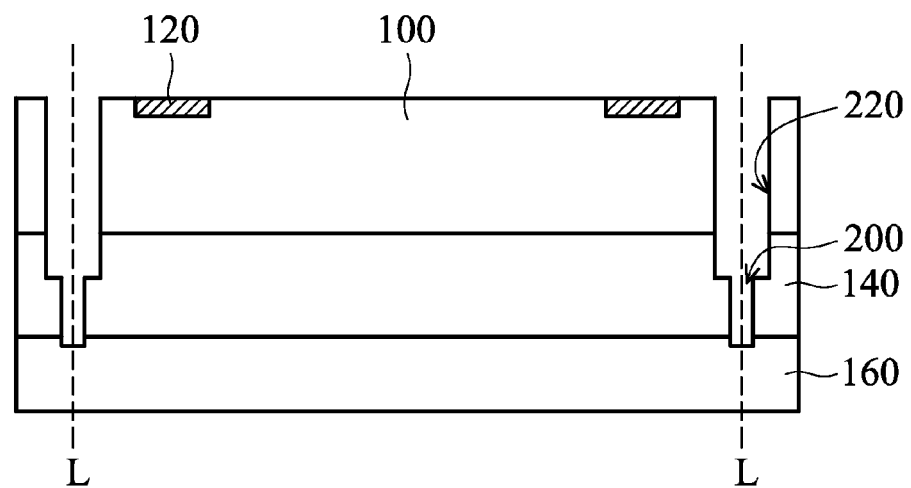

Referring to FIG. 1C, second openings 220 corresponding to the first openings 200 may be formed by a dicing process. The second openings 220 penetrate through the first substrate 100 and have a bottom located in the adhesive layer 140. In the embodiment, the first opening 200 vertically overlaps the corresponding second opening 220, and the diameter of the second opening 220 is greater than that of the first opening 200. As a result, the first opening 200 in the adhesive layer 140 and the corresponding second opening 220 in the adhesive layer 140 form an opening having stepped sidewalls.

In the embodiment of FIG. 1A to 1C, the second opening 220 with a shallow depth is formed after the first opening 200 with a deep depth is formed, such that the first opening 200 is aligned to the second substrate 160 and the subsequently formed second opening 220 only needs to be aligned to the first opening 200. Therefore, forming the second opening 220 with a shallow depth after forming the first opening 200 with a deep depth is able to facilitate improving the accuracy of dicing the first substrate 100 and the adhesive layer 140. In other embodiments, the first opening 200 with a deep depth may be formed after the second opening 220 with a shallow depth is formed. In this case, the subsequently formed first opening 200 needs to be simultaneously aligned to the second substrate 160 and the second opening 220.

Figure 1D:
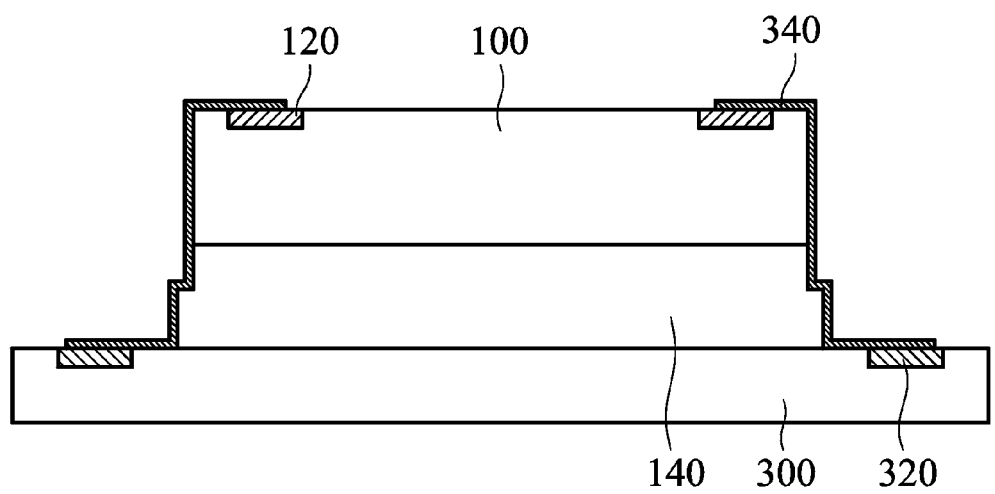

Referring to FIG. 1D, after the first openings 200 and the second openings 220 are formed, the split portions formed of the first substrate 100 and the adhesive layer 140 are separated from the second substrate 160. Next, the first substrate 100 of the split portion (i.e. the chip) is attached onto a circuit board 300 through the adhesive layer 140 of the split portion. In one embodiment, the adhesive layer 140 is formed of a material that becomes adhesive after being heated. Therefore, after the first substrate 100 is separated from the second substrate 160, the separated first substrate 100 is able to be directly attached onto the circuit board 300 without using adhesive glue. In another embodiment, the first substrate 100 may be separated from the adhesive layer 140, and then the separated first substrate 100 (i.e. the chip) may be attached onto the circuit board 300 with adhesive glue.

In the embodiment, the circuit board 300 has a plurality of conducting pads 320, which may be adjacent to the upper surface of the circuit board 300. In one embodiment, the conducting pads 320 may be a single conducting layer or comprise multiple conducting layers. Only a single conducting layer is depicted herein as an example.

Next, a patterned redistribution layer (RDL) 340 may be formed on the upper surface of the first substrate 100 by a deposition process (such as a coating process, a physical vapor deposition process, a chemical vapor deposition process, a plating process, an electroless plating process or another suitable process), a lithography process and an etching process to electrically connect the conducting pads 120. The redistribution layer 340 extends along the sidewalls of the first substrate 100 onto the stepped sidewalls of the adhesive layer 140, and further extends to the circuit board 300 to electrically connect to corresponding conducting pads 320 in the circuit board 300. In one embodiment, the redistribution layer 340 may comprise copper, aluminum, gold, platinum, nickel, tin, a combination thereof or another suitable conductive material. In another embodiment, the redistribution layer 340 may comprise a conductive polymer material or a conductive ceramic material (such as indium tin oxide or indium zinc oxide). To simplify the diagram, an insulating layer formed between the upper surface and sidewalls of the first substrate 100 and the redistribution layer 340 for electrical isolation is not shown and described herein.

Figure 2:
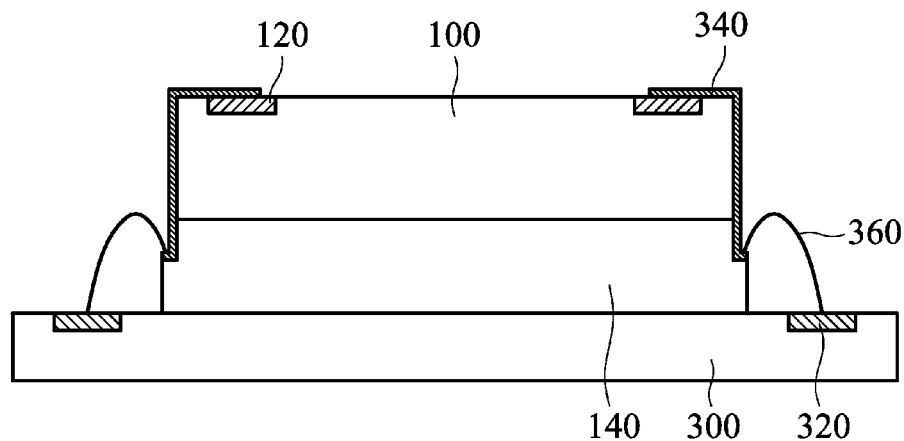
FIGS. 2 to 4 are cross-sectional views of various exemplary embodiments of a chip package according to the invention.

In another embodiment, as shown in FIG. 2, the redistribution layer 340 electrically connected to the conducting pads 120 merely extends on the stepped sidewalls of the adhesive layer 140 without extending to the circuit board 300. Subsequently, a wire bonding process is performed to form bonding wires 360 on the redistribution layer 340 on the stepped sidewalls, and the bonding wires 360 extend onto the circuit board 300 so as to electrically connect to the corresponding conducting pads 320 in the circuit board 300.

Figure 3:
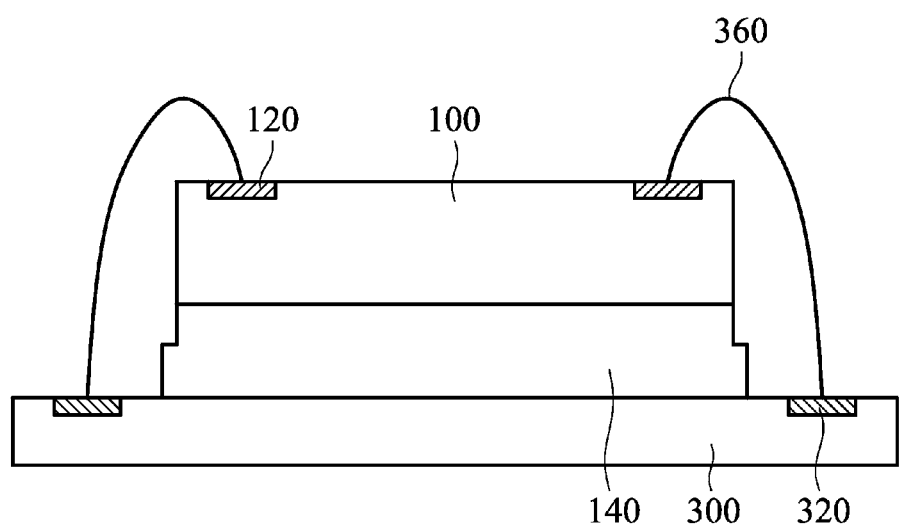

In yet another embodiment, as shown in FIG. 3, the conducting pads 120 in the first substrate 100 may be electrically connected to the corresponding conducting pads 320 in the circuit board 300 through only the bonding wires 360 without the redistribution layer 340.

Figure 4:
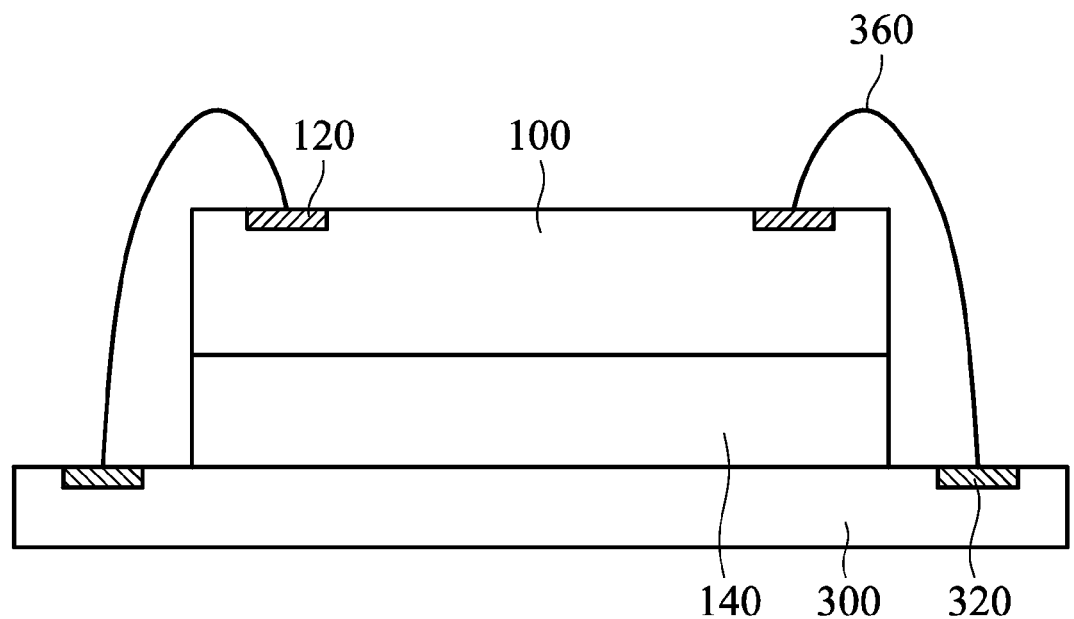

In other embodiments, as shown in FIG. 4, after the steps shown in FIGS. 1A and 1B, the split portions formed of the first substrate 100 and the adhesive layer 140 may be directly separated from the second substrate 160 without forming the second openings 220. The separated first substrate 100 is attached onto the circuit board 300 through the adhesive layer 140. Next, the conducting pads 120 in the first substrate 100 are electrically connected to the corresponding conducting pads 320 in the circuit board 300 through suitable conducting structures (such as bonding wires 360). Alternatively, the conducting pads 120 in the first substrate 100 may be electrically connected to the corresponding conducting pads 320 in the circuit board 300 through the redistribution layer 340 (as shown in FIG. 1D).

Another exemplary embodiment of a method for forming a chip package according to the invention is illustrated with FIGS. 5A to 5D, wherein FIGS. 5A to 5D are cross-sectional views of another exemplary embodiment of a method for forming a chip package according to the invention, and wherein elements in FIGS. 5A to 5D that are the same as those in FIGS. 1A to 1D are labeled with the same reference numbers as in FIGS. 1A to 1D and are not described again for brevity.

Figure 5A:
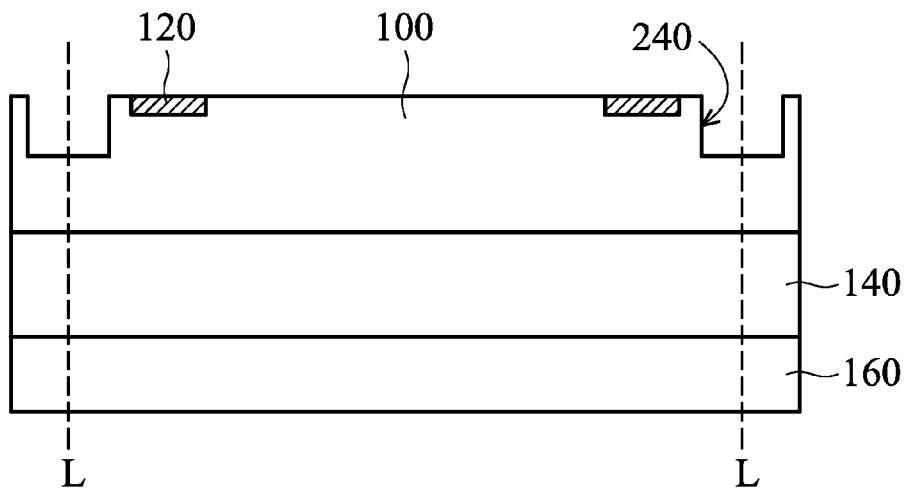
FIGS. 5A to 5D are cross-sectional views of another exemplary embodiment of a method for forming a chip package according to the invention.

Referring to FIG. 5A, a first substrate 100 is attached onto a second substrate 160 through an adhesive layer 140 by the same step as shown in FIG. 1A. Next, third openings 240 aligning to the scribe lines L are formed in the first substrate 100 by an etching process (such as a dry etching process). The bottom of the third opening 240 is positioned within the first substrate 100.

Figure 5B:

Referring to FIG. 5B, a dicing process is performed to form first openings 200 corresponding to the third openings 240 in a similar step to that shown in FIG. 1B. The first openings 200 penetrate through the first substrate 100 and the adhesive layer 140, and separate the first substrate 100 and the adhesive layer 140 into a plurality of portions.

In the embodiment, the first opening 200 vertically overlaps the corresponding third opening 240, and the diameter of the third opening 240 is greater than that of the first opening 200. As a result, the first opening 200 in the adhesive layer 140 and the corresponding third opening 240 in the adhesive layer 140 form an opening having stepped sidewalls.

Figure 5C:
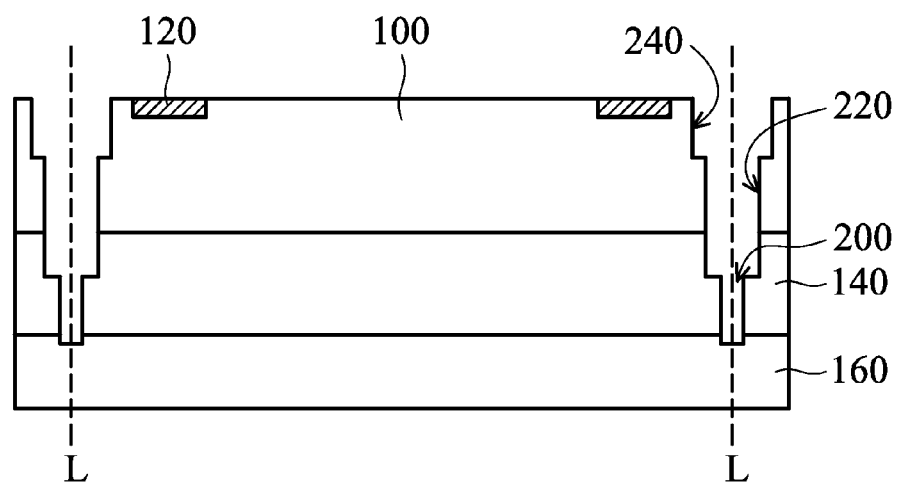

Referring to FIG. 5C, a dicing process is performed to form second openings 220 corresponding to the first openings 200 and the third openings 240 in a similar step to that shown in FIG. 1C. The second opening 220 penetrates through the first substrate 100 and has a bottom positioned within the adhesive layer 140.

In the embodiment, the second opening 220 vertically overlaps the corresponding first opening 200 and third opening 240. The diameter of the second opening 220 is greater than that of the first opening 200 and is less than that of the third opening 240. As a result, the second opening 220 in the first substrate 100 and the corresponding third opening 240 in the first substrate 100 form an opening having stepped sidewalls. The second opening 220 in the adhesive layer 140 and the corresponding first opening 200 in the adhesive layer 140 also form another opening having stepped sidewalls. In other words, the first opening 200 and the corresponding second opening 220 and third opening 240 form an opening having multi-step sidewalls.

Similarly, in the embodiment of FIG. 5A to 5C, the second opening 220 with a shallow depth is formed after the first opening 200 with a deep depth is formed. In other embodiments, the first opening 200 with a deep depth may be formed after the second opening 220 with a shallow depth is formed.

Figure 5D:
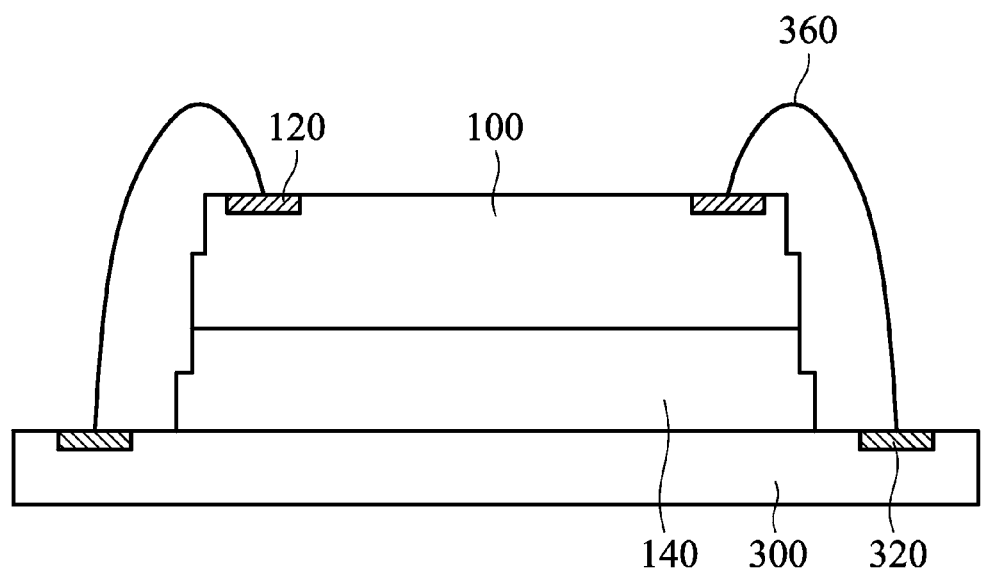

Referring to FIG. 5D, after the first openings 200, the second openings 220 and the third openings 240 are formed, the split portions formed of the first substrate 100 and the adhesive layer 140 are separated from the second substrate 160. Next, the separated first substrate 100 (i.e. the chip) is directly attached onto a circuit board 300 through the adhesive layer 140 of the split portion. In another embodiment, the first substrate 100 may be separated from the adhesive layer 140, and then the separated first substrate 100 may be attached onto the circuit board 300 through additional adhesive glue.

Next, a wire bonding process is performed to form bonding wires 360 on the conducting pads 120 in the first substrate 100 and extending onto the circuit board 300 so as to electrically connect to the corresponding conducting pads 320 in the circuit board 300.

In another embodiment, a patterned redistribution layer 340 may be formed on the upper surface of the first substrate 100 by a deposition process, a lithography process and an etching process to electrically connect the conducting pads 120. The redistribution layer 340 extends along the multi-step sidewalls formed of the first substrate 100 and the adhesive layer 140, and further extends to the circuit board 300 to electrically connect to corresponding conducting pads 320 in the circuit board 300. In other embodiments, the redistribution layer 340 electrically connected to the conducting pads 120 merely extends on the multi-step sidewalls formed of the first substrate 100 and the adhesive layer 140 without extending to the circuit board 300. The redistribution layer 340 is then electrically connected to the corresponding conducting pads 320 in the circuit board 300 through the bonding wires 360.

Yet another exemplary embodiment of a method for forming a chip package according to the invention is illustrated with FIG. 6A to 6E, wherein FIG. 6A to 6E are cross-sectional views of yet another exemplary embodiment of a method for forming a chip package according to the invention, and wherein elements in FIG. 6A to 6E that are the same as those in FIGS. 1A to 1D and 5A to 5D are labeled with the same reference numbers as in FIGS. 1A to 1D and 5A to 5D and are not described again for brevity.

Figure 6A:
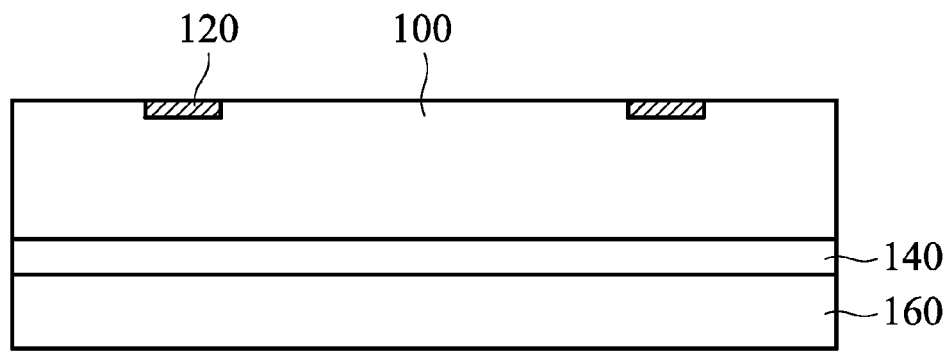
FIGS. 6A to 6E are cross-sectional views of yet another exemplary embodiment of a method for forming a chip package according to the invention.

Referring to FIG. 6A, a first substrate 100 is attached onto a second substrate 160 through an adhesive layer 140 by the same step as shown in FIG. 1A. In the embodiment, the second substrate 160 comprises glass, aluminum nitride, sapphire, or another suitable substrate material. In one embodiment, the second substrate 160 may optionally serve as a temporary carrier substrate/wafer.

Figure 6B:
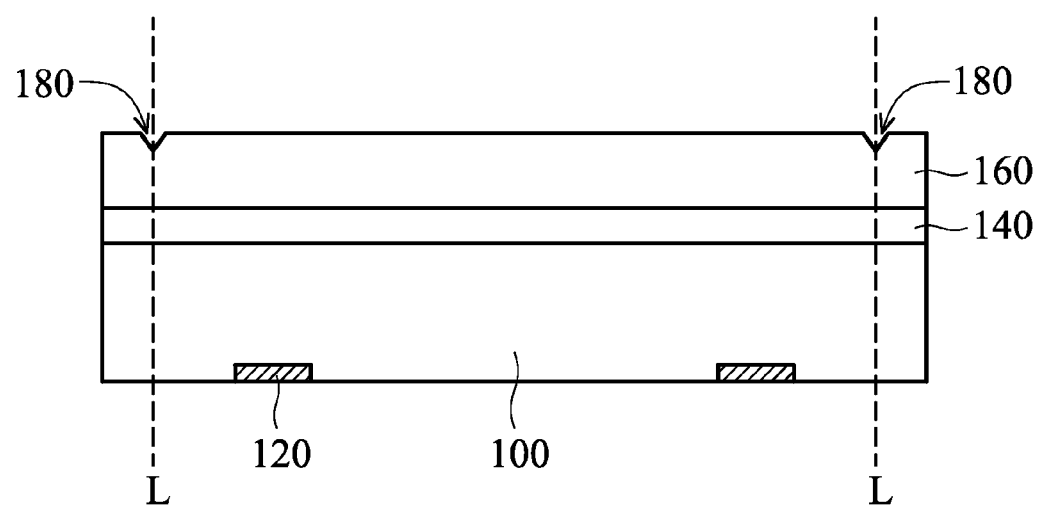

Referring to FIG. 6B, a cutting wheel or another suitable notching tool may be used along scribe lines L that define the chip regions to form a plurality of notches 180 on a surface of the second substrate 160, which faces away from the adhesive layer 140 and the first substrate 100. In other words, the notch 180 surrounds the chip region along the scribe lines L as viewed from a top-view perspective. As a result, the second substrate 160 previously comprises cracks corresponding to the scribe lines L, thereby facilitating the subsequent separation of the second substrate 160. In other embodiments, the notches 180 may be formed in the second substrate 160 by using a laser cutting tool.

Figure 6C:
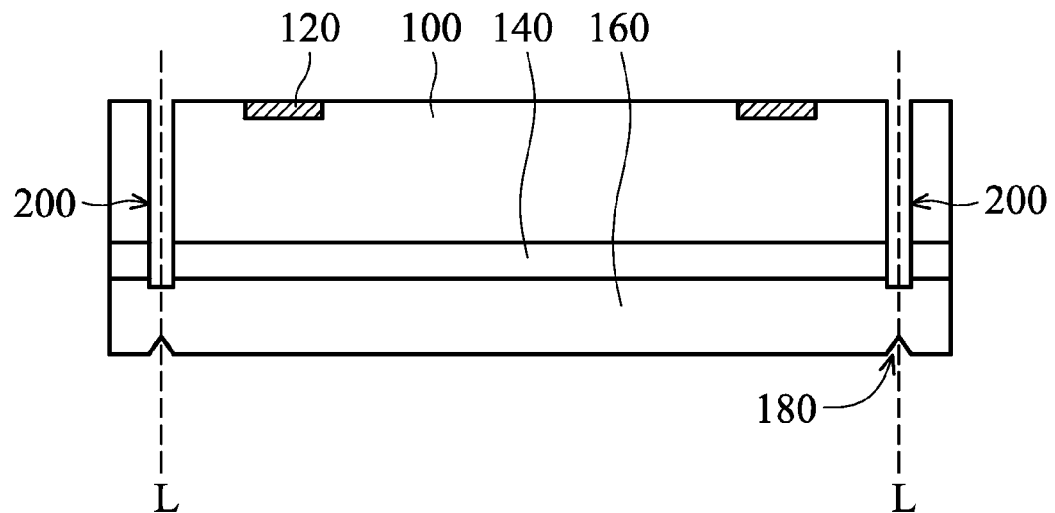

Referring to FIG. 6C, first openings 200 may be formed by a dicing process. The first openings 200 penetrate through the first substrate 100 and the adhesive layer 140, thereby separating the first substrate 100 and the adhesive layer 140 into a plurality of portions corresponding to the chip regions. For example, a dicing tape (not shown) may be provided under the surface of the second substrate 160 where the notches 180 are formed. The first substrate 100 and the adhesive layer 140 are then diced along the scribe lines L by a dicing blade so as to form first openings 200. Namely, the first opening 200 surrounds the chip region along the scribe lines L as viewed from a top-view perspective. In other embodiments, the first openings 200 may be formed by laser cutting technology.

In the embodiment, the first opening 200 is aligned to the notch 180 and is spaced apart from the notch 180 by a vertical distance without communicating with the notch 180. In the embodiment, the depth of the notch 180 is much less than the thickness of the second substrate 160, and the depth of the first opening 200 is at least equal to or greater than the thickness of the first substrate 100. In one embodiment, the first opening 200 extends from the adhesive layer 140 into the second substrate 160. In another embodiment, the first opening 200 may merely expose the surface of the second substrate 160 without extending into the second substrate 160. In other embodiments, the first opening 200 may at least penetrate through the first substrate 100 and optionally extend into the adhesive layer 140.

Figure 6D:
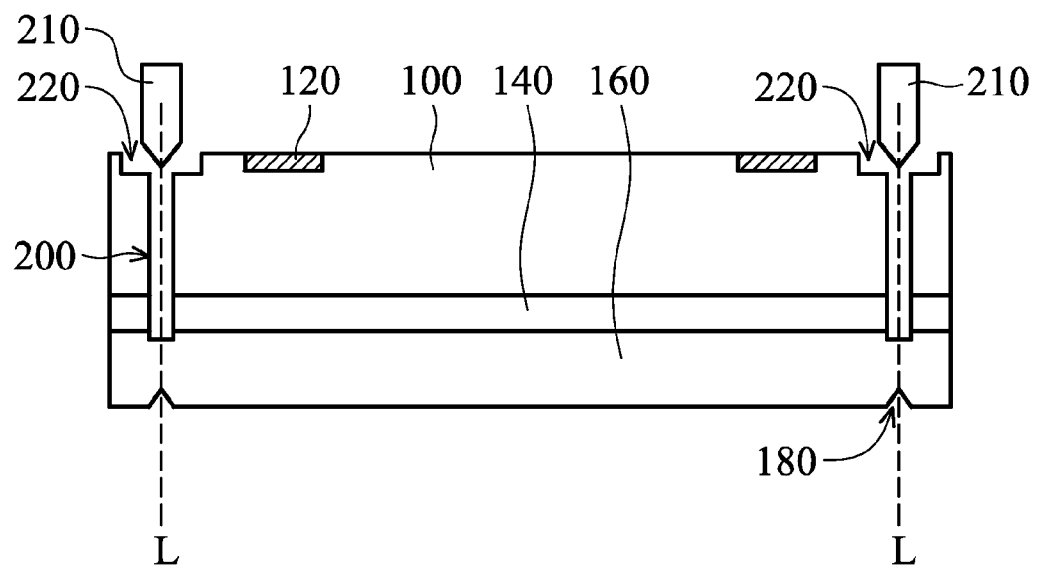
Figure 6E:
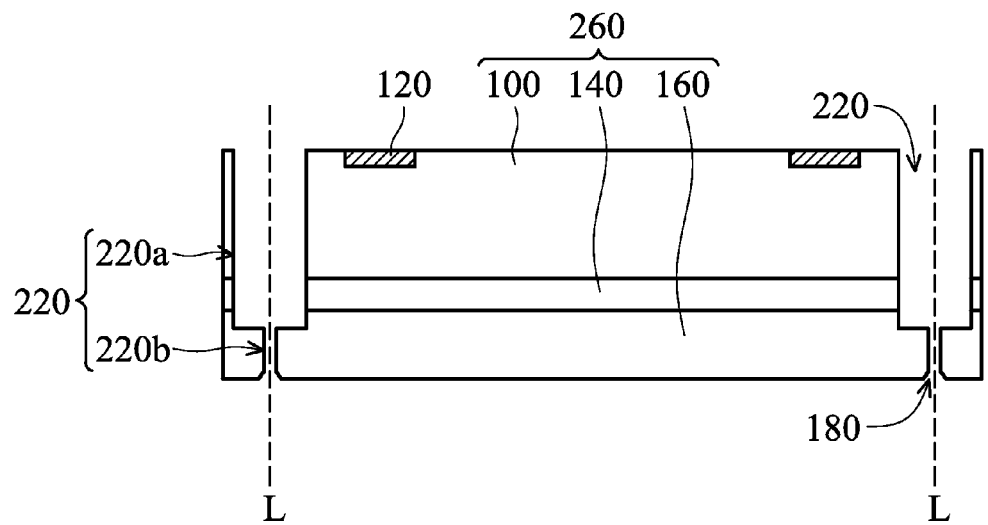

Referring to FIGS. 6D and 6E, a breaking cut process using pins 210 or another suitable breaking tool is performed to form second openings 220, thereby separating the second substrate 160 into a plurality of portions corresponding to the chip regions as well. As a result, the diced first substrate 100, the diced adhesive layer 140, and the diced second substrate 160 constitute a chip 260.

For example, second openings 220 are formed in the first substrate 100 by downwardly pressing the pins 210 from the top of the first openings 200, as shown in FIG. 6D. The pins 210 are further downwardly pressed along the first openings 200 until the second openings 220 communicate with the notches 180 in the second substrate 160, as shown in FIG. 6E. Specifically, the formed second opening 220 comprises an upper portion 220a and a lower portion 220b. The diameter of the upper portion 220a is greater than that of the lower portion 220b, such that the second opening 220 has stepped sidewalls. The upper portion 220a with a larger diameter penetrates through the first substrate 100 and the adhesive layer 140, and extends into the second substrate 160. The lower portion 220b with a smaller diameter adjoins the upper portion 220a and communicates the upper portion 220a with the notch 180. Therefore, both the diced first substrate 100 and the diced adhesive layer 140 have straight sidewalls, while the diced second substrate 160 has stepped sidewalls. In other words, the size of the upper portion of the second substrate 160 is equal to that of the first substrate 100 and the adhesive layer 140, and the size of the lower portion of the second substrate 160 is greater than that of the first substrate 100 and the adhesive layer 140. Accordingly, the chip 260 has a T-shaped cross-section.

In the embodiment, the top of the second opening 220 (such as the upper portion 220a) has a greater diameter than that of the first opening 200, as shown in FIG. 6D. In one embodiment, the lower portion 220b of the second opening 220 has a smaller diameter than that of the notch 180, such that the sidewalls of the diced second substrate 160 may be chipped due to the notch 180, as shown in FIG. 6E. In another embodiment, the second opening 220 vertically overlaps the notch 180, and the lower portion 220b of the second opening 220 has a diameter equal to that of the notch 180, such that the sidewalls of the diced second substrate 160 are not chipped. In other embodiments, the lower portion 220b of the second opening 220 has a greater diameter than that of the notch 180 and completely penetrates through the notch 180, such that the sidewalls of the diced second substrate 160 may not be chipped, as shown in FIG. 7.

Next, the chip 260 is separated from the aforementioned dicing tape. Thereafter, similar to the embodiment of FIG. 2, the chip 260 may be bonded onto a circuit board 300. Conducting pads 120 in the chip 260 may be electrically connected to corresponding conducting pads 320 in the circuit board 300 through a redistribution layer 340 and bonding wires 360, as shown in FIG. 7. The redistribution layer 340 is formed on the stepped sidewall of the second opening 220, and is located on the upper portion 220a without extending to the lower portion 220b. In other embodiments, the embodiments of FIG. 1D or FIG. 3 may be implemented, and thus the conducting pads 120 in the chip 260 may be electrically connected to the circuit board 300 through only one of the redistribution layer 340 and the bonding wire 360.

Figure 7:
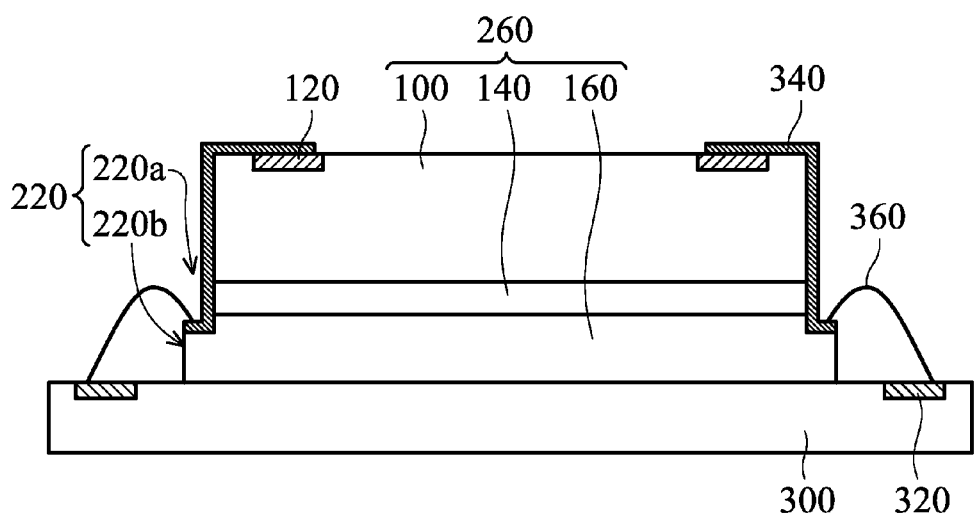
FIG. 7 is a cross-sectional view of another exemplary embodiment of a chip package according to the invention.

In one embodiment, the chip 260 bonded to the circuit board 300 is formed of the first substrate 100, the adhesive layer 140 and the second substrate 160, as shown in FIG. 7. However, in other embodiments, the chip 260 bonded to the circuit board 300 may be formed of only the first substrate 100 and adhesive layer 140 or only the first substrate 100, depending on design requirements. In those cases, the chip 260 has straight sidewalls and does not comprise a stepped sidewall.

It should be realized that the size, contour, and positioning of various openings and notches shown in the figures are illustrated as an example and that they are not limited thereto. The actual size, contour, and positioning of these openings and notches are determined by design requirements.

In the conventional wafer dicing process, the edge sidewalls of the diced chip can easily develop protrusions as a result of the worn dicing blade, and thus the edge sidewalls of the chip can become cracked. According to the aforementioned embodiments, the first substrate 100 is attached onto the second substrate 160 providing support through the adhesive layer 140, and the first openings 200 are formed by a dicing process to penetrate through the first substrate 100 and the adhesive layer 140. Therefore, the diced first substrate 100 can have straight sidewalls to prevent the edge sidewalls of the chip from having protrusions and becoming cracked. Accordingly, the reliability of the chip package is improved.

Referring to FIG. 1D, a cross-sectional view of an exemplary embodiment of a chip package according to the invention is illustrated. In the embodiment, the chip package comprises a first substrate 100 and an adhesive layer 140. In one embodiment, the first substrate 100 may be a silicon substrate or another semiconductor substrate.

In the embodiment, the first substrate 100 has a plurality of conducting pads 120 therein, which may be adjacent to the upper surface of the first substrate 100. In one embodiment, the conducting pad 120 may be a single conducting layer or comprise multiple conducting layers. Only a single conducting layer is depicted herein as an example.

In the embodiment, the first substrate 100 may have a sensing device (not shown) disposed on the upper surface of the first substrate 100. In one embodiment, the sensing device may be electrically connected to the conducting pads 120 through an interconnection structure (not shown). The sensing device may comprise an environment-sensing element (such as a temperature-sensing element, a humidity-sensing element, or a pressure-sensing element), a biometric-sensing element (such as a fingerprint-recognition element), an image-sensing element or another suitable sensing element.

The adhesive layer 140 is disposed on the first substrate 100 and has stepped sidewalls. The stepped sidewalls are located outside of the conducting pads 120. A first portion of the stepped sidewall is coplanar with the sidewall of the first substrate 100. A second portion of the stepped sidewall protrudes from the sidewall of the first substrate 100. In the embodiment, the first substrate 100 has straight sidewalls, while the adhesive layer 140 has stepped sidewalls. In other words, the size of the upper portion of the adhesive layer 140 is equal to that of the first substrate 100, and the size of the lower portion of the adhesive layer 140 is greater than that of the first substrate 100. Accordingly, the first substrate 100 and the adhesive layer 140 form a T-shaped cross-section. In the embodiment, the adhesive layer 140 may comprise a tape, a die-attach film, or another suitable adhesive material. Furthermore, the thickness of the adhesive layer 140 may be in a range of 5 µm to 20 µm.

In the embodiment, the chip package further comprises a circuit board 300 and a redistribution layer 340. The circuit board 300 is attached to the first substrate 100 through the adhesive layer 140. The redistribution layer 340 is disposed on the first substrate 100 and is electrically connected to the conducting pads 120 within the first substrate 100. The redistribution layer 340 extends onto the circuit board 300 along the sidewall of the first substrate 100 and the stepped sidewall of the adhesive layer 140 to electrically connect to the corresponding conducting pads 320 in the circuit board 300. In one embodiment, the redistribution layer 340 may comprise copper, aluminum, gold, platinum, nickel, tin, a combination thereof or another suitable conductive material. In another embodiment, the redistribution layer 340 may comprise a conductive polymer material or a conductive ceramic material (such as indium tin oxide or indium zinc oxide).

Referring to FIGS. 2 to 4 and 5D, cross-sectional views of various exemplary embodiments of a chip package according to the invention are illustrated, wherein elements in FIGS. 2 to 4 and 5D that are the same as those in FIG. 1D are labeled with the same reference numbers as in FIG. 1D, and are not described again for brevity. The chip package structures shown in FIGS. 2 and 3 are similar to that shown in FIG. 1D. The difference between the chip package structures shown in FIGS. 2 and 1D is that the redistribution layer 340 shown in FIG. 2 only extends onto the stepped sidewall of the adhesive layer 140. The redistribution layer 340 is electrically connected to the corresponding conducting pads 320 through the bonding wires 360 which is disposed on the stepped sidewall and extends onto the circuit board 300. Furthermore, the difference between the chip package structures shown in FIGS. 3 and 1D is that the chip package structure shown in FIG. 3 comprises the bonding wires 360, rather than the redistribution layer 340 shown in FIG. 1D, so as to electrically connect the conducting pads 120 in the first substrate 100 to the corresponding conducting pads 320 in the circuit board 300.

The chip package structure shown in FIG. 4 is similar to that shown in FIG. 3. The difference therebetween is that the adhesive layer 140 shown in FIG. 4 has straight sidewalls, rather than stepped sidewalls. Furthermore, the chip package structure shown in FIG. 5 is similar to that shown in FIG. 3. The difference therebetween is that the first substrate 100 shown in FIG. 5 has stepped sidewalls as well. The stepped sidewalls of the adhesive layer 140 protrude from the stepped sidewalls of the first substrate 100, such that the sidewalls of the first substrate 100 and the adhesive layer 140 form multi-step sidewalls.

Moreover, referring to FIG. 7, a cross-sectional view of another exemplary embodiment of a chip package according to the invention is illustrated, wherein elements in FIG. 7 that are the same as those in FIGS. 1D, 2 to 4 and 5D are labeled with the same reference numbers as in FIGS. 1D, 2 to 4 and 5D, and are not described again for brevity. The chip package structure shown in FIG. 7 is similar to that shown in FIG. 2. The difference therebetween is that the adhesive layer 140 shown in FIG. 2 has stepped sidewalls, while the adhesive layer 140 shown in FIG. 7 has straight sidewalls. A second substrate 160 is disposed between the adhesive layer 140 and the circuit board 300, as shown in FIG. 7, and the second substrate 160 has stepped sidewalls. Therefore, the redistribution layer 340 extends from the first substrate 100 through the adhesive layer 140 onto the stepped sidewalls of the second substrate 160.

In the embodiment of FIG. 7, the stepped sidewalls of the second substrate 160 are located outside of the conducting pads 120. A first portion of the stepped sidewall is coplanar with the sidewall of the first substrate 100. A second portion of the stepped sidewall protrudes from the sidewall of the first substrate 100. Moreover, the size of the upper portion of the second substrate 160 is equal to that of the first substrate 100 and the adhesive layer 140, and the size of the lower portion of the second substrate 160 is greater than that of the first substrate 100 and the adhesive layer 140. Accordingly, the chip 260 has a T-shaped cross-section.

In the aforementioned embodiments, since the adhesive layer 140 or the first substrate 100 has a stepped sidewall, the redistribution layer 340 formed on the first substrate 100 can extend onto the stepped sidewall and the bonding wire 360 only extends from the stepped sidewall onto the circuit board 300. Therefore, the overall height of the bonding wire 360 is reduced, thereby reducing the size of the chip package.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A method for forming a chip package, comprising:
providing a first substrate and a second substrate;
attaching the first substrate onto the second substrate by an adhesive layer;
forming a plurality of first openings, wherein the plurality of first openings penetrates through the first substrate and the adhesive layer, such that the first substrate and the adhesive layer are separated into a plurality of portions;
forming a plurality of second openings before or after the plurality of first openings is formed, wherein the plurality of second openings corresponds to the plurality of first openings and penetrates through the first substrate, and wherein bottoms of the plurality of second openings are located in the adhesive layer; and
separating the plurality of portions of the first substrate and the adhesive layer from the second substrate after the plurality of first openings is formed.

2. The method as claimed in claim 1, wherein the step of forming the plurality of first openings comprises performing a dicing process.

3. The method as claimed in claim 1, wherein the plurality of first openings in the adhesive layer and the plurality of second openings in the adhesive layer form a plurality of openings having a stepped sidewall.

4. The method as claimed in claim 1, wherein the step of forming the plurality of second openings comprises performing a dicing process.

5. The method as claimed in claim 1, further comprising forming a plurality of third openings in the first substrate before the plurality of first openings is formed, wherein the plurality of third openings corresponds to the plurality of first openings and bottoms of the plurality of third openings are located in the first substrate.

6. The method as claimed in claim 5, wherein the plurality of first openings, the plurality of second openings, and the plurality of third openings form a plurality of openings having a stepped sidewall.

7. The method as claimed in claim 5, wherein the plurality of first openings in the first substrate and the plurality of third openings in the first substrate form a plurality of openings having a multi-step sidewall.

8. The method as claimed in claim 5, wherein the step of forming the plurality of third openings comprises performing an etching process.

9. The method as claimed in claim 1, further comprising forming a plurality of notches in the second substrate before the plurality of first openings is formed, wherein the plurality of first openings is aligned to the plurality of notches.

10. The method as claimed in claim 9, wherein the plurality of first openings is spaced apart from the plurality of notches by a distance without communicating with the plurality of notches.

11. The method as claimed in claim 9, further comprising forming a plurality of second openings to separate the second substrate after the plurality of first openings is formed, wherein the plurality of second openings extends from the first substrate along the plurality of first openings to penetrate through the adhesive layer and further extends into the second substrate.

12. The method as claimed in claim 11, wherein the plurality of second openings communicates with the plurality of notches.

13. The method as claimed in claim 11, wherein the second substrate has a stepped sidewall.

14. A method for forming a chip package, comprising:
attaching a first substrate onto a second substrate by an adhesive layer;
forming a first opening, wherein the first opening penetrates through the first substrate and the adhesive layer, such that the first substrate and the adhesive layer are separated into a plurality of portions; and
forming a second opening, wherein the second opening corresponds to the first opening and penetrates through the first substrate, and wherein a bottom of the second opening is located in the adhesive layer.

15. The method as claimed in claim 14, wherein the first opening in the adhesive layer and the second opening in the adhesive layer form an opening having a stepped sidewall, and the method further comprises forming a redistribution layer on the first substrate and extending onto the stepped sidewall.

16. The method as claimed in claim 15, further comprising forming a bonding wire on the redistribution layer on the stepped sidewall and extending onto a circuit board.

17. A method for forming a chip package, comprising:
attaching a first substrate onto a second substrate by an adhesive layer;
forming a notch in the second substrate; and
forming a first opening aligned to the notch, wherein the first opening penetrates through the first substrate and the adhesive layer, such that the first substrate and the adhesive layer are separated into a plurality of portions.

18. The method as claimed in claim 17, wherein the notch is formed on a surface of the second substrate which faces away from the adhesive layer and the first substrate.

19. The method as claimed in claim 17, further comprising forming a second opening extending from the first substrate along the first opening and further extending into the second substrate, wherein an upper portion of the second opening in the first substrate is wider than a lower portion the second opening in the second substrate.

* * * * *